United States Patent
Koga et al.

(10) Patent No.: US 8,400,254 B2
(45) Date of Patent: Mar. 19, 2013

(54) SURGE ABSORBING ELEMENT

(75) Inventors: Eiichi Koga, Hokkaido (JP); Noriko Sawada, Hokkaido (JP); Mikinori Amisawa, Hokkaido (JP); Seiichi Minami, Hokkaido (JP); Hirofumi Yamada, Hokkaido (JP); Tomohisa Okimoto, Hokkaido (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/203,223

(22) PCT Filed: Apr. 13, 2010

(86) PCT No.: PCT/JP2010/002660
§ 371 (c)(1),
(2), (4) Date: Aug. 24, 2011

(87) PCT Pub. No.: WO2010/122732
PCT Pub. Date: Oct. 28, 2010

(65) Prior Publication Data
US 2011/0304946 A1    Dec. 15, 2011

(30) Foreign Application Priority Data

Apr. 23, 2009  (JP) ................................ 2009-104974
Oct. 15, 2009  (JP) ................................ 2009-238064

(51) Int. Cl.
*H01C 7/10*    (2006.01)

(52) U.S. Cl. ................................ 338/20; 338/21; 338/13

(58) Field of Classification Search ...................... 338/20
See application file for complete search history.

(56) References Cited

U.S. PATENT DOCUMENTS

| | | | | |
|---|---|---|---|---|
| 5,509,558 | A | * | 4/1996 | Imai et al. ..................... 218/143 |
| 5,629,666 | A | * | 5/1997 | Imai et al. ..................... 338/20 |
| 5,815,063 | A | * | 9/1998 | Goto et al. .................. 338/22 R |
| 6,087,923 | A |   | 7/2000 | Ahn et al. |
| 7,167,352 | B2 | * | 1/2007 | Matsuoka et al. .......... 361/306.1 |
| 7,973,638 | B2 | * | 7/2011 | Koga et al. ..................... 338/21 |
| 2005/0276001 | A1 |   | 12/2005 | Matsuoka et al. |

FOREIGN PATENT DOCUMENTS

| | | |
|---|---|---|
| CN | 1113026 A | 12/1995 |
| CN | 1707703 A | 12/2005 |
| JP | 10-302928 | 11/1998 |
| JP | 11-003809 | 1/1999 |
| JP | 2002-110405 | 4/2002 |
| JP | 2005-353845 | 12/2005 |

\* cited by examiner

*Primary Examiner* — Kyung Lee
(74) *Attorney, Agent, or Firm* — McDermott Will & Emery LLP

(57) ABSTRACT

A surge absorbing element has a first electrode, a second electrode, and a ceramic layer. The second electrode is opposed to the first electrode. The ceramic layer has a polycrystal structure including a plurality of crystal grains showing voltage nonlinearity, and is at least partially brought into contact with the first electrode and the second electrode. The ceramic layer has a void inside therein, and surface discharge is generated on surfaces, exposed to the void, of the crystal grains, whereby electric conduction is attained between the first and second electrodes.

14 Claims, 7 Drawing Sheets

SURGE ABSORBING ELEMENT

RELATED APPLICATIONS

This application is the U.S. National Phase under 35 U.S.C. §371 of International Application No. PCT/JP2010/002660, filed on Apr. 13, 2010, which in turn claims the benefit of Japanese Application Nos. 2009-104974, filed on Apr. 23, 2009 and 2009-238064, filed on Oct. 15, 2009, the disclosures of which applications are incorporated by reference herein.

TECHNICAL FIELD

The present invention relates to a surge absorbing element having a ceramic layer showing voltage nonlinearity.

BACKGROUND ART

Semiconductor devices such as ICs and LSIs are broken or deteriorated in characteristics by electrostatic discharge (hereinafter referred to as ESD). The wiring patterns of recent semiconductor devices have become fine with a rise in the operation clock thereof; thus, it is particularly important to take a measure against ESD. As a countermeasure against such ESD, a surge absorbing element is fixed to be interposed between lines of input/output terminals of a semiconductor device and the ground. The surge absorbing element makes it possible to bypass a surge having a high voltage caused by electrostatic discharge (hereinafter referred to as an ESD voltage), thereby protecting the semiconductor device.

As illustrated in FIG. 11, a surge absorbing element has ceramic layer 41, a pair of internal electrodes 42 and 43, ceramic insulator 44, and external electrodes 45 and 46. Ceramic layer 41, which has varistor characteristics, is made mainly of ZnO. Internal electrodes 42 and 43 are opposed to each other to sandwich ceramic layer 41 therebetween. In this way, a varistor section is set up. Ceramic insulator 44 covers the varistor section. External electrodes 45 and 46 are formed at both ends of ceramic insulator 44, respectively. One end of internal electrode 42 and the same of internal electrode 43 are exposed to both ends of ceramic insulator 44, respectively, to be electrically connected to external electrodes 45 and 46, respectively. Such a surge absorbing element is disclosed in, for example, Patent Document 1.

When a conventional surge absorbing element is used in, in particular, a high-speed signal line, the surge absorbing element causes deterioration in the quality of high-speed signals, such as a waveform strain thereof, through the capacitance component of ceramic layer 41. For this reason, a surge absorbing element having a very small capacitance is used for a countermeasure against ESD.

In order to make the capacitance of the surge absorbing element small, it is necessary to decrease a region where internal electrodes 42 and 43 overlap with each other via ceramic layer 41 interposed therebetween. This manner gives an increase in the current density per area in the region where internal electrodes 42 and 43 overlap with each other, when a high-voltage surge, such as electrostatic discharge, is applied to the surge absorbing element. Therefore, the varistor characteristics are deteriorated, or ceramic layer 41 is broken. Thus, it is difficult to lower the suppression voltage of a surge absorbing element, and the surge absorbing element is further declined in resistance against static electricity.

CITATION LIST

Patent Document

Patent Document 1: Unexamined Japanese Patent Publication No. H11-3809

SUMMARY OF THE INVENTION

The present invention provides a surge absorbing element that is lowered in suppression voltage. The surge absorbing element of the present invention has a first electrode, a second electrode, and a ceramic layer. The second electrode is opposed to the first electrode. The ceramic layer has a polycrystal structure including a plurality of crystal grains showing voltage nonlinearity, and is at least partially brought into contact with the first electrode and the second electrode. The ceramic layer has a void inside the layer, and surface discharge occurs on surfaces, exposed to the void, of the crystal grains, thereby electric conduction is attained between the first and second electrodes. According to this structure, the surge absorbing element can have a lowered suppression voltage.

DETAILED DESCRIPTION OF THE INVENTION

Figure 1:
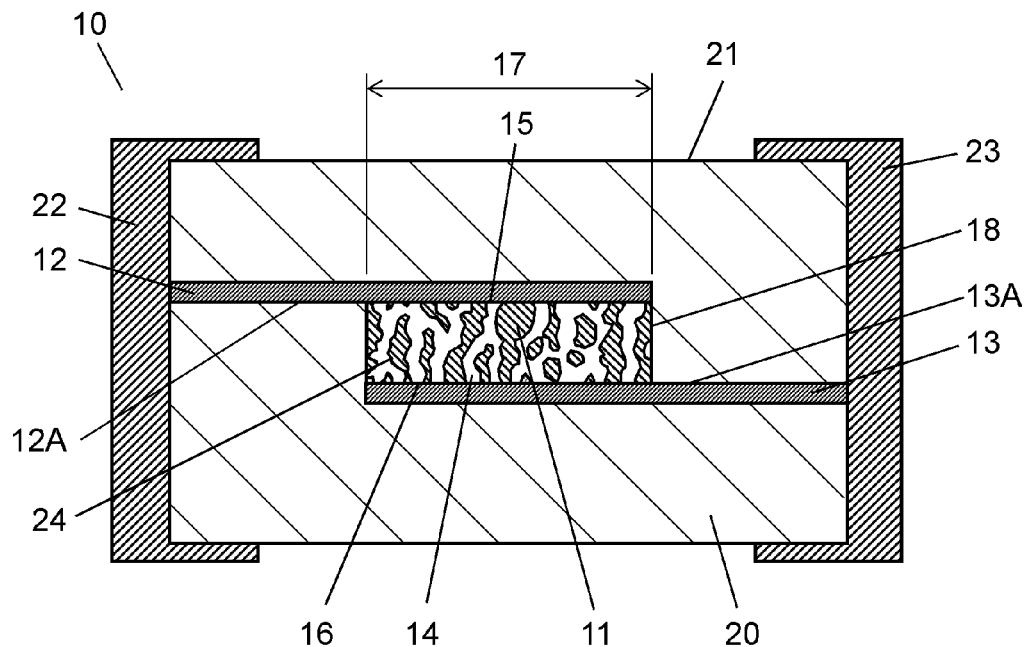
FIG. 1 is a sectional view of a surge absorbing element according to an embodiment of the present invention.

FIG. 1 is a sectional view of a surge absorbing element according to an embodiment of the present invention. Surge absorbing element 10 is a ceramic laminated electronic component in which external electrodes 22 and 23 are arranged onto front surfaces of both ends of ceramic laminate 21, respectively.

Ceramic laminate 21 has ceramic insulator 20 which is an outer layer. Ceramic insulator 20 has therein ceramic layer 11, electrode 12 that is a first electrode, and electrode 13 that is a second electrode. Ceramic layer 11, which has a substantially constant thickness, shows voltage nonlinearity. Each of electrodes 12 and 13, which are internal electrodes, is at least partially brought into contact with ceramic layer 11. Electrode 13 is opposed to electrode 12.

Ceramic layer 11 and electrodes 12 and 13 are laminated to form varistor section 18. Varistor section 18 is buried in ceramic laminate 21. Each of electrodes 12 and 13 is a thin film in the form of a sheet having a substantially constant thickness. A metal material is preferably used therefor, and the material may be Pd, an Ag—Pd alloy, or Pt. Electrodes 12 and 13 are extended from ceramic layer 11 toward two end faces of ceramic laminate 21, respectively, these end faces being opposed to each other, and further electrodes 12 and 13 are electrically connected to external electrodes 22 and 23, respectively, on respective end faces of ceramic laminate 21.

Principal surface 12A of sheet-form electrode 12 and principal surface 13A of sheet-form electrode 13 at least partially sandwich ceramic layer 11 in the electrode-laminated direction. Hereinafter, a region where electrodes 12 and 13 overlap with each other will be referred to gap region 17. In gap region 17, electrodes 12 and 13 contact laminating surfaces of ceramic layer 11, and electrodes 12 and 13 are arranged at a predetermined interval and in substantially parallel to each other. As described herein, surge absorbing element 10 has electrodes 12 and 13, and ceramic layer 11, and ceramic layer 11 contacts electrodes 12 and 13 at least partially.

When a nominal external dimension of surge absorbing element 10 is 2.0 mm in length×1.25 mm in width×1.25 mm in height, or less dimension, the distance between electrodes 12 and 13 in gap region 17 is preferably set into the range of 2 μm to 50 μm. In other words, the thickness of ceramic layer 11 is preferably set into the range of 2 μm to 50 μm. Such a small and thin surge absorbing element chip can realize good surge absorbency. It is also preferable that the thickness of each of electrodes 12 and 13 is set to 3 μm or more. Such a thickness makes it possible to prevent electrodes 12 and 13 from being fired and lost by electric discharge, thereby improving the surge absorbing element in resistance against static electricity.

Ceramic layer 11 is made of a varistor material that is a nonlinear resistance composition dependent on voltage. Specifically, the layer has a polycrystal structure made of a plurality of crystal grains showing voltage nonlinearity. The crystal grains contain, for example, ZnO as a main component. The polycrystal structure made of the crystal grains have a structure in which the crystal grains are brought into contact with and connected to each other between electrodes 12 and 13.

Ceramic layer 11 has a porous structure having voids 14 inside the layer. When an ESD voltage is applied thereto, the following appears to be caused: portions of electrodes 12 and 13 that contact voids 14 turn to discharge starting points, so that electric discharge occurs in voids 14 inside ceramic layer 11, thereby paths in which a surge current of ESD passes are formed. More specifically, it appears that electric conduction paths inside ceramic layer 11 are formed by the occasion of surface discharge conducted on surfaces of the crystal grains of the varistor material, which contact voids 14, through boundaries of the crystal. In other words, electric conduction would be attained between electrodes 12 and 13 by the generating surface discharge of exposed-surfaces 24 of the crystal grains that are exposed to voids 14. This surface discharge would make it possible to generate ESD absorption at a lower ESD voltage than the voltage for gas discharge so as to make the suppression voltage of the surge absorbing element low.

The varistor material preferably contains, besides ZnO, an element having a same melting point as ZnO or higher, as a secondary element; examples of the element include Sr, Ca, Ba, Co, Cr, Mn and Al. In this case, the surge absorbing element is excellent in thermal stability, and is improved in resistance against static electricity. The dielectric constant of ceramic insulator 20 is preferably smaller than that of ceramic layer 11. This manner makes it possible to decrease the stray capacitance of surge absorbing element 10 to make the capacitance small.

As described above, in order to generate surface discharge inside ceramic layer 11 on exposed-surfaces 24 of the crystal grains that are exposed to voids 14, the surge absorbing element specifically needs to satisfy the following condition:

at least one of the following requirements is satisfied: ceramic layer 11 has a void ratio of 25% by volume or more to 92% by volume or less; and voids 14 contain a through-void through which electrode 12 communicates with electrode 13.

In a case where the void ratio of ceramic layer 11 is 25% by volume or more to 92% by volume or less, it seems that when an ESD voltage is applied to the surge absorbing element, the suppression voltage turns low so that surface discharge easily occurs on exposed-surfaces 24 of the crystal grains. The void ratio denotes the percentage of the total sum of the volumes of voids 14 with respect to the volume of ceramic layer 11.

In ordinary surge absorbing elements, the void ratio of their varistor material is about 10% by volume or less. On the other hand, the void ratio of ceramic layer 11 is a high value of 25% to 92% by volume. Thus, even when the varistor material is deteriorated by ESD to be lowered in resistance, the deterioration is not easily increased. As a result, resistance against static electricity is better than those of the ordinary surge absorbing elements. The void ratio of ceramic layer 11 is more preferably 55% by volume or more to 92% by volume or less, even more preferably 64% by volume or more to 87% by volume or less. When the range of the void ratio is restricted in this way, the suppression voltage can be remarkably lowered and further the resistance against static electricity can be improved. If the void ratio is more than 92% by volume, the polycrystal structure of ceramic layer 11 is not easily brought into contact with nor connected to each other between electrodes 12 and 13 so that electric conduction paths cannot be formed inside ceramic layer 11 by any surface discharge.

When voids 14 contain the through-void through which electrode 12 communicates with electrode 13, continuous surface discharge is easily generated between electrodes 12 and 13 so that the suppression voltage can be remarkably lowered. Moreover, an electrical load onto the varistor is decreased by the surface discharge, so that the structure of the varistor material is not easily broken by ESD voltage. Thus, the surge absorbing element is improved in resistance against static electricity.

The through-voids through which electrode 12 communicates with electrode 13 include at least one of a three-dimensional network structure in which pores are three-dimensionally interlaced to be connected to each other, straight through holes, and bent through holes.

When void 14 through which electrode 12 communicates with electrode 13 is not present, a portion of the varistor material between any two of voids 14 in ceramic layer 11 is broken by the application of electricity thereto, so as to be removed, whereby a through hole is made between the two of voids 14. Alternatively, the varistor material between voids 14 is electrically broken to form a low-resistance resistor. By aid of the through hole or the low-resistance resistor, electric conduction paths are easily formed in voids 14 inside ceramic layer 11 by the surface discharge. Thus, the surge absorbing element can be made stable in suppression voltage. The resistance value of the low-resistance resistor is preferably ⅓ or less of that between the crystal grains in a high-resistance state before the breakage.

In the laminating surfaces of ceramic layer 11 in gap region 17, openings 15 and 16 in voids 14 are closed with principal surfaces 12A and 13A of sheet-form electrodes 12 and 13. For this reason, flat surface portions of principal surfaces 12A and 13A of electrodes 12 and 13 that contact openings 15 and 16 become discharge starting points, so that electric discharge is generated inside ceramic layer 11. As a result, the concentration of the density of electric current based on ESD in electrodes 12 and 13 is decreased so that burnout abrasion of electrodes 12 and 13 due to the electric discharge is decreased. Therefore, even when an ESD voltage is repeatedly applied to the surge absorbing element, the surge absorbing element can make the suppression voltage thereof lower than surge absorbing elements having a structure in which end faces of paired electrodes are made near to each other so that a discharge gap is formed between the end faces.

The surge absorbing element needs to satisfy, as another condition, at least one of the following requirements:

(1) a solid solution that has a perovskite structure and is a p-type semiconductor is present in grain boundaries of the crystal grains containing ZnO as a main component; and (2) a solid solution that is represented by the composition formula $ABO_3$ and has a perovskite structure is present in grain boundaries of the crystal grains containing ZnO as a main component. In this solid solution, the site A is at least one of alkaline earth metals Sr, Ca and Ba, and the site B is at least one of transition metals Co, Mn and Cr.

When the grain boundaries have either one of structure (1) or (2), surface discharge is easily generated on exposed-surfaces 24 of the crystal grains at a relatively low ESD voltage. Thus, the surge absorbing element can be made low in suppression voltage. Moreover, the surge absorbing element is excellent in thermal stability to be made high in resistance against static electricity.

In the case (2), the content by percentage of the perovskite-structure solid solution as a secondary component, in which the site A is at least one of Sr, Ca and Ba and the site B is at least one of Co, Mn and Cr, is preferably 0.3% by mole or more and 15% by mole or less of the total of the main component ZnO and the secondary component, more preferably 0.3% by mole or more and 10% by mole or less thereof. Thanks to the range, the surge absorbing element can be made low in suppression voltage, and further can be improved in resistance against static electricity.

As described above, the surge absorbing element satisfies at least one of the following: the void ratio of ceramic layer 11 is 25% by volume or more and 92% by volume or less; and voids 14 contain a through-void through which electrode 12 communicates with electrode 13. And the solid solution having either of the above-mentioned perovskite structures is formed in the grain boundaries. It is considered that when the surge absorbing element satisfies the two conditions, surface discharge is generated in exposed-surfaces 24 of the crystal grains that are exposed to voids 14, so that electric conduction is attained between electrodes 12 and 13.

Figure 2:
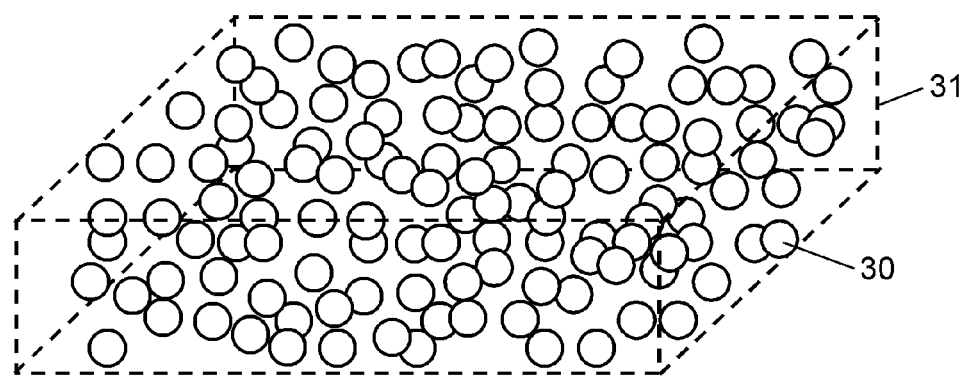
FIG. 2 is a transparent view of a ceramic green body used for producing the surge absorbing element illustrated in FIG. 1.
Figure 3:
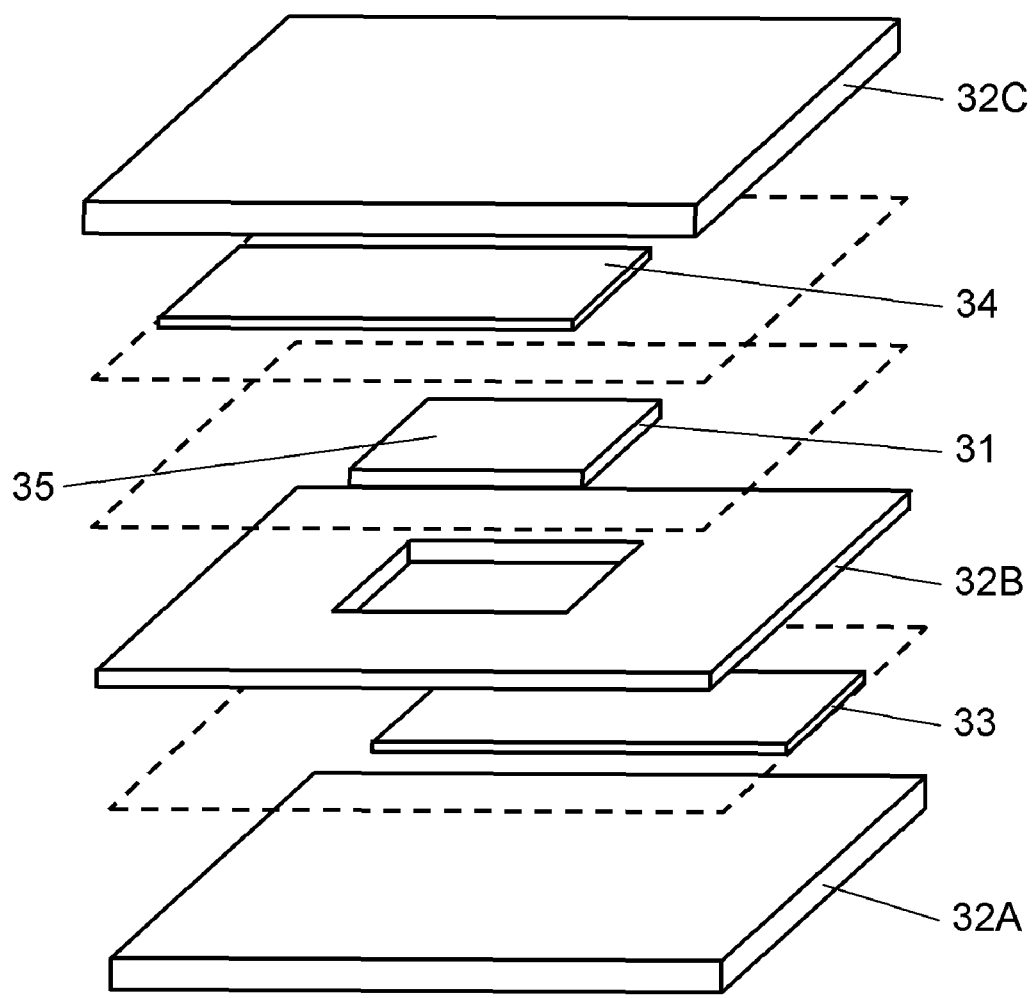
FIG. 3 is a perspective view illustrating a producing procedure of the surge absorbing element illustrated in FIG. 1.

The following will describe a process for producing surge absorbing element 10 with reference to FIGS. 2 and 3. FIG. 2 is a transparent view of a ceramic green body in the present embodiment, and FIG. 3 is a perspective view illustrating a producing procedure of this laminated green sheet.

First, the following are mixed into a uniform state: a ceramic powder showing voltage nonlinearity, an organic binder, and a solvent, and preferably further resin particles 30. In this way, a ceramic slurry or ceramic paste is prepared. A plasticizer and the like may be incorporated into the ceramic slurry or ceramic paste.

Resin particle 30 is made of polymeric material. Thermal decomposition of the polymeric material is finished at about 600° C. or lower. The material is preferably a thermoplastic resin. Resin particle 30 may be at least one of a sphere and an ellipse, or may be in the form of complete sphere. The spherical and elliptic form is, for example, a form that the ratio of the longest diameter "a" to the shortest diameter "b", the ratio a/b, is 1.25 or less in about 95% or more by number of the particles.

Next, as illustrated in FIG. 3, an electroconductive paste is painted onto outer-layer green sheet 32A by screen printing or the like method, and then dried to form electroconductive substrate 33 in the form of a thin film having a predetermined shape. Outer-layer green sheet 32A and electroconductive substrate 33 will be turned into ceramic insulator 20 and electrode 13, respectively, after firing which will be described later.

Next, ceramic green body 31 and outer-layer green sheet 32B are formed on outer-layer green sheet 32A and electroconductive substrate 33. Thereafter, an electroconductive paste is used to form electroconductive substrate 34 onto ceramic green body 31. Subsequently, outer-layer green sheet 32C is laminated thereon. Outer-layer green sheets 32B and 32C will be turned into ceramic insulator 20, and electroconductive substrate 34 into electrode 12 after the firing, which will be described later. Additionally, ceramic green body 31 will be turned into ceramic layer 11.

As illustrated in FIG. 2, ceramic green body 31 contains a plurality of resin particles 30. Ceramic green body 31 is formed on electroconductive substrate 33 by making ceramic slurry into a shape by a doctor blade method, a reverse roll coater method, or some other, or making a ceramic paste into a shape by screen printing, gravure printing, or some other.

Meanwhile, it is allowable to form ceramic green body 31 onto outer-layer green sheet 32A and electroconductive substrate 33, and then form electroconductive substrate 34 onto ceramic green body 31 and outer-layer green sheet 32A without using outer-layer green sheet 32B.

In those ways, ceramic green body 31 is brought into contact with electroconductive substrates 33 and 34 to integrate these members with each other. Ceramic green body 31 and electroconductive substrates 33 and 34 will form a varistor section after the firing.

Subsequently, the temperature of this laminate is raised up to a temperature at which the organic binder and resin particles 30 can be burned out to treat the laminate thermally, thereby decomposing and removing the organic binder and resin particles 30, which are contained in ceramic green body 31, to form ceramic layer 11 having voids 14.

When the ceramic slurry or ceramic paste contains a plurality of resin particles 30 in this way, a structure is easily formed in which the crystal grains of ceramic layer 11 are brought into contact with and connected to each other so as to contact voids 14. As a result, the surge absorbing element can be made low in suppression voltage.

Moreover, by the use of resin particles 30, openings 15 and 16 of voids 14 are made to be dispersed within principal surfaces 12A and 13A of electrodes 12 and 13 in gap region 17. This makes it possible to decrease the concentration of the density of electric current based on ESD inside electrodes 12 and 13, thereby preventing burnout abrasion of electrodes 12 and 13 based on the electric discharge and lowering the suppression voltage.

The proportion by volume of resin particles 30 contained in the ceramic slurry or ceramic paste is preferably 10% by volume or more and 80% by volume or less with respect to the total of the ceramic powder and the resin particles. Due to the ratio, the surge absorbing element can be remarkably lowered in suppression voltage.

The average particle diameter of resin particles 30 is preferably made larger than that of the ceramic powder. This manner makes it easy to form the structure in which the crystal grains of ceramic layer 11 are brought into contact with and connected to each other and are in contact with voids 14. Thus, the suppression voltage can be made low. Moreover, the average particle diameter of resin particles 30 is preferably made equal to or less than the thickness of ceramic layer 11. The average particle diameter referred to herein is a value of 50% cumulative distribution ($D_{50}$) obtained by making a measurement with a particle size distribution measuring instrument.

In this way, ceramic green body 31 is brought into contact with electroconductive substrates 33 and 34, which are to be electrodes 12 and 13, respectively, so as to integrate these members with each other, and then the organic binder and resin particles 30 are caused to vanish, thereby making voids 14. In such a way, the structure in FIG. 1 can be formed, and portions of electrodes 12 and 13 that contact openings 15 and 16 in voids 14 become discharge starting points, so that discharge paths can be formed along surfaces of the grains inside voids 14. Thus, the surge absorbing element can be made remarkably small in suppression voltage.

Subsequently, the laminate after thermal treatment, in which voids 14 are made, is made into chips, and further the chips are each fired to form ceramic laminate 21 having ceramic layer 11 showing voltage nonlinearity.

Next, a paste containing electroconductive particles made of silver, copper or the like is painted onto both end regions of ceramic laminate 21, and then the paste is baked thereon to form underlying electrodes. The uppers of the underlying electrodes are plated with tin or the like to form external electrodes 22 and 23. As described above, surge absorbing element 10 is completed.

Figure 4:
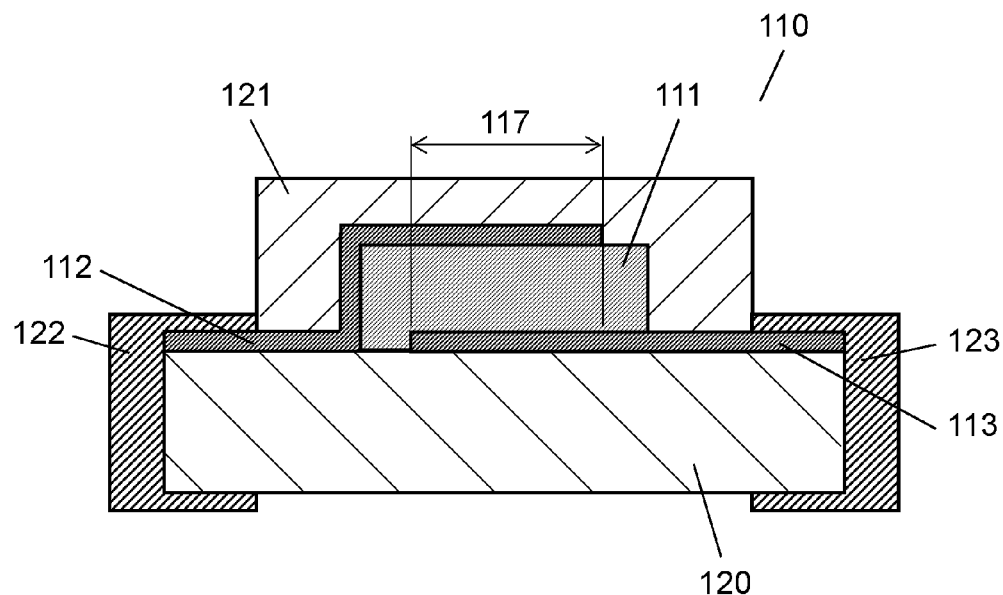
FIG. 4 is a sectional view of another surge absorbing element according to the embodiment of the present invention.

Another example of the present embodiment is surge absorbing element 110 having a structure as illustrated in FIG. 4. Surge absorbing element 110 has ceramic insulator 120 which is a support, sheet-form electrodes 112 and 113, ceramic layer 111, insulating resin 121, and external electrodes 122 and 123. Electrodes 112 and 113 are laminated onto a flat surface of ceramic insulator 120 to form gap region 117 thereon. In gap region 117, ceramic layer 111 is at least partially sandwiched between electrodes 112 and 113 to form a varistor section.

Insulating resin 121 is laid on the upper surface of ceramic insulator 120 to cover the varistor section. External electrodes 122 and 123 are located at both ends of ceramic insulator 120, respectively, to be electrically connected to electrodes 112 and 113, respectively.

Ceramic layer 111 has the same structure as ceramic layer 11 illustrated in FIG. 1, which is not illustrated. In other words, ceramic layer 111 has a polycrystal structure made of a plurality of crystal grains showing voltage nonlinearity. The surge absorbing element satisfies at least one of the following: ceramic layer 111 has a void ratio of 25% by volume or more and 92% by volume or less; and ceramic layer 111 has through-voids through which electrode 112 communicates with electrode 113. Furthermore, the crystal grains contain ZnO as a main component, and a solid solution that is a p-type semiconductor and has a perovskite structure is present in grain boundaries of the crystal grains; or the crystal grains contain ZnO as a main component, and a solid solution represented by the composition formula $ABO_3$ and having a perovskite structure is present in grain boundaries of the crystal grains. The site A is at least one of Sr, Ca and Ba. The site B is at least one of Co, Mn and Cr.

The same advantageous effects are produced also when the varistor section is covered with insulating resin 121 besides the ceramic insulator, as described above.

EXAMPLES

Hereinafter, the advantageous effects of the present embodiment will be described by way of specific examples of surge absorbing element 10 illustrated in FIG. 1.

Examples 1 to 7

First, an oxide powder of ZnO as a main component, and oxide powders of $SrCoO_3$ and $Co_2O_3$ as secondary components are prepared as starting materials of ceramic layer 11. The starting materials are weighed to cause ceramic layer 11 to have a composition ratio of $(ZnO)_{0.97}(SrCoO_3)_{0.03}$.

These starting material powders are put into a ball mill made of polyethylene, and then stone balls made of stabilized zirconia, and pure water are added thereto. The components therein are mixed with each other for about 20 hours, and then the mixture is dehydrated and dried to prepare a dry powder. Next, this dry powder is put into a crucible made of high-purity alumina, and calcined at about 750° C. for 2 hours to prepare a calcined powder. Furthermore, this calcined powder, stone balls made of stabilized zirconia, and pure water are put into a ball mill made of polyethylene to pulverize the powder for about 20 hours. The pulverized powder is then dehydrated and dried to prepare a ceramic powder made mainly of ZnO and having an average particle diameter of 0.7 μm.

Next, this ceramic powder, resin particles 30, an organic binder, a plasticizer, and a solvent are mixed with each other to prepare a ceramic paste. Resin particles 30 used are in the form of a complete sphere made of acrylic resin and having an average particle diameter of 2 μm. Accordingly, the ratio of the average particle diameter of resin particles 30 with respect to that of the ceramic powder is 2.85. The used organic binder is an alkyd resin, and the used plasticizer is phthalate ester. The organic binder is contained in a liquid state or low-viscosity state. The used solvent is material that does not swell the acrylic resin, or is small in effect of swelling the acrylic resin.

The contents by percentage of resin particles 30 in the ceramic pastes of Examples 1 to 7 are set to 50%, 10%, 20%, 40%, 70%, 80% and 5% by volume, respectively. The organic binder is added so that the ratio of the total volume of the organic binder to the total sum of the volumes of the ceramic powder and resin particles 30 is made constant. As to the blending described above, for example, the ceramic paste of Example 1 is described as follows by use of the ratio by weight: 30 parts by weight of the organic binder, 8 parts by weight of the plasticizer, and 25 parts by weight of the solvent are blended with respect to 100 parts by weight of the total of the ceramic powder and resin particles 30.

Subsequently, out-layer green sheets 32A, 32B and 32C illustrated in FIG. 3, and an electroconductive paste for forming electroconductive substrates 33 and 34 are prepared. The outer-layer green sheets are low-temperature co-fired ceramic (LTCC) sheets containing alumina particles and borosilicate glass. The sheets each have a dielectric constant of about 10 after fired. The electroconductive paste is prepared by mixing an Ag—Pd alloy powder in which the ratio by weight of Ag/Pd is 70/30, an organic binder, and the same solvent as in the ceramic paste with each other.

Next, the electroconductive paste is painted onto outer-layer green sheet 32A by screen printing, and then dried to laminate electroconductive substrate 33 that is a thin film having a thickness of 5 μm to 10 μm and is patterned into a predetermined form. Furthermore, outer-layer green sheet 32B is laminated onto outer-layer green sheet 32A and electroconductive substrate 33. Subsequently, the ceramic paste is painted by screen printing to be filled into a rectangle through hole in outer-layer green sheet 32B, and then dried. The solvent is then evaporated to laminate ceramic green body 31 on electroconductive substrate 33.

Next, the electroconductive paste is painted onto laminating surface 35, which is an outer surface of ceramic green body 31, by screen printing and then dried to laminate electroconductive substrate 34, thereby putting electroconductive substrate 34 over electroconductive substrate 33 to interpose ceramic green body 31 therebetween.

Subsequently, outer-layer green sheet 32C is laminated onto electroconductive substrate 34, and then the individual elements of the resultant are bonded to each other under pressure to form a laminated green sheet. This laminated green sheet is cut into individual pieces. In this way, green chips are produced.

Next, the temperature of each of the green chips is raised at a constant rate in the atmosphere, and then the chip is kept at 500° C. for 5 hours to treat the green chip thermally. By this thermal treatment, the binder is removed and resin particles 30 contained in ceramic green body 31 are decomposed and removed to make voids 14. This thermal treatment is conducted at a temperature of 400° C. to 600° C. The period during which this temperature is kept is adjusted into the range of 1 hour to 10 hours.

Next, each of the green chips in which voids 14 are made is put into a sheath made of heat-resistant zirconia. The chip is fired in an oxygen atmosphere. The firing temperature and the temperature keeping period are adjusted in the range of 900° C. to 1100° C. and 30 minutes to 5 hours, respectively. In this way, ceramic laminate 21 is formed which has a dimension of 0.6 mm in length, 0.3 mm in width, and 0.3 mm in height and has ceramic layer 11 having a thickness of 7 μm. In this laminate, cross section of gap region 17, between electrodes 11 and 12, along the laminating surfaces thereof is in the form of a rectangle 100 μm in length and 100 μm in width. A solid solution of $SrCoO_3$ is present in the grain boundary of ceramic layer 11. The grain boundary is a p-type semiconductor. It can be checked whether or not such a solid solution is present by a high-resolution transmission electron microscope (HRTEM) or the like. It can be checked whether or not grain boundary is a p-type semiconductor by a scanning non-linear dielectric microscope (SNDM) or the like.

Furthermore, silver paste is painted onto both ends of ceramic laminate 21, and then dried. Thereafter, the silver paste is baked thereon at a temperature of 600° C. to 800° C. Next, a nickel layer and a tin layer are successively formed onto the surface of the baked silver paste by electroplating to form external electrodes 22 and 23. In this way, surge absorbing elements 10 each illustrated in FIG. 1 are produced.

Examples 8 to 10

In each of Examples 8 to 10, a ceramic paste is used, in which the ceramic powder, the organic binder, the plasticizer and the solvent in Example 1 are mixed without incorporating the resin particles into the ceramic paste in Example 1, and the content by percentage of the organic binder is variously changed. In the same way as in Example 1 except this matter, surge absorbing elements 10 are produced.

Comparative Example 1

In Comparative Example 1, in the same way as in Examples 8 to 10, no resin particles are incorporated into the ceramic paste. And a ceramic paste is used, in which the content by percentage of the organic binder is made smaller than that in Example 9, and the ceramic powder, the organic binder, the plasticizer and the solvent in Example 9 are mixed with each other. In the same way as in Example 9 except this matter, surge absorbing elements are produced.

Comparative Example 2

Figure 6:
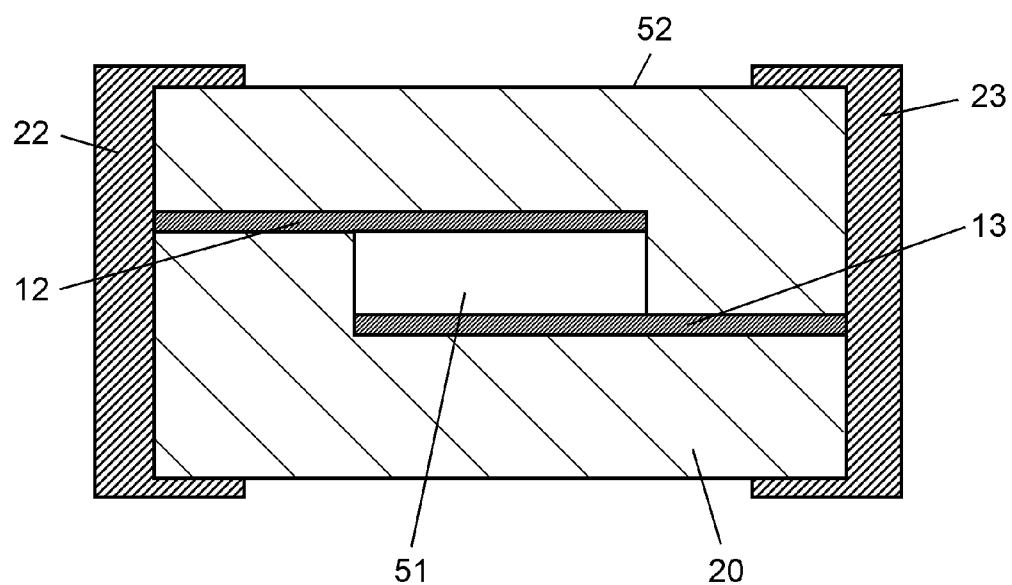
FIG. 6 is a sectional view of a different surge absorbing element for comparison with the surge absorbing elements according to the embodiment of the present invention.

As illustrated in FIG. 6, in a surge absorbing element of Comparative Example 2, external electrodes 22 and 23 that are to be connected electrically to electrodes 12 and 13 are laid onto both ends of ceramic laminate 52, respectively. Cavity 51 is made in the whole between opposed principal surfaces of electrodes 12 and 13 in the gap region that is formed between electrodes 12 and 13 to have an interval of 7 μm therebetween. Cavity 51 is covered with ceramic insulator 20 to constitute a discharge gap. In other words, the surge absorbing element of Comparative Example 2 is produced in the same way as in Example 1 except for using a ceramic paste in which resin particles 30, the organic binder, the plasticizer and the solvent in Example 1 are mixed with each other without incorporating any ceramic powder thereinto.

Next, about each of the respective samples of Examples 1 to 10 and Comparative Example 1, an examination is made as to whether or not through-voids through which electrode 12 communicates with electrode 13 are present in ceramic layer 11. Specifically, according to the cross section polisher (CP) method, ceramic layer 11 between electrodes 12 and 13 is polished with Ar ions, and a polished cross section thereof is observed to make an evaluation.

Moreover, the surge absorbing elements of the samples of each of Examples 1 to 10 and Comparative Examples 1 to 2 are evaluated about the following electric characteristics; the capacitance, the suppression voltage, and the resistance thereof against static electricity.

About the capacitance, ten is selected from the samples, the electrostatic capacities thereof are measured with no DC bias at a measuring frequency of 1 MHz and a measuring voltage of 1 Vrms, and the average is calculated out. About the suppression voltage, ten is selected from the samples, and ESD voltages of three levels of 2 KV, 8 kV and 12 kV are successively applied to each of the ten. The suppression voltages in those cases are measured. The average thereof at each of the ESD voltages is then calculated out.

Figure 5:
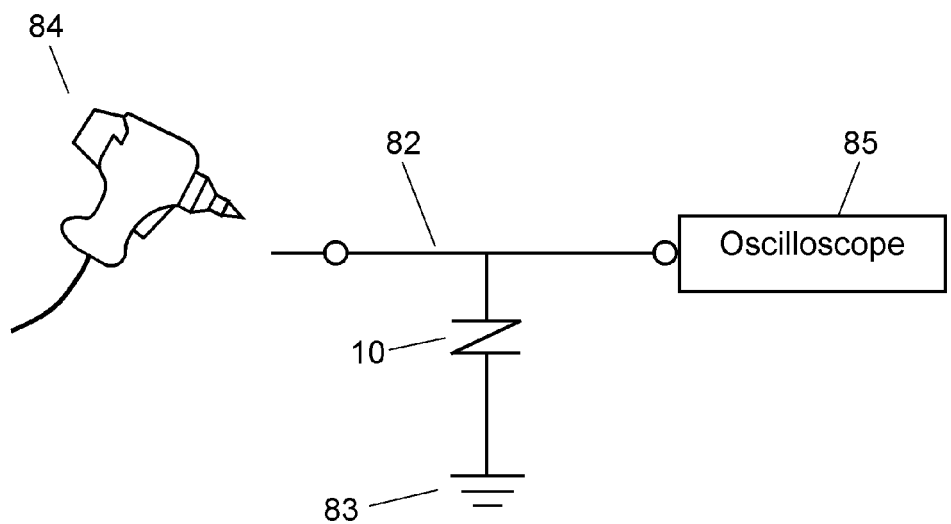
FIG. 5 is a schematic view illustrating a measurement method for a suppression voltage.

About the suppression voltage, a measurement device illustrated in FIG. 5 is used to make an evaluation on the basis of an electrostatic discharge immunity test complying with IEC61000-4-2. In the measuring device, surge absorbing element 10 that is each of the evaluating samples and is mounted on the evaluating substrate is interposed between line 82 and GND 83 so as to be connected thereto. From discharge gun 84 connected to an electrostatic simulator, electrostatic pulses having a predetermined ESD voltage are outputted to front-side line 82 of surge absorbing element 10. When surge absorbing element 10 is operated, the electrostatic pulses are bypassed to GND 83, and absorbed therein. As a result, pulse components in rear-side line 82 of surge absorbing element 10 are suppressed. The pulse waveform at this rear side is observed through oscilloscope 85. The peak voltage value of the pulse waveform is defined as the suppression voltage. The charge capacitance of the electrostatic simulator is 150 pF, and the discharge resistance thereof is 330Ω. A 50Ω system of oscilloscope 85 is used to make the observation.

Figure 7A:
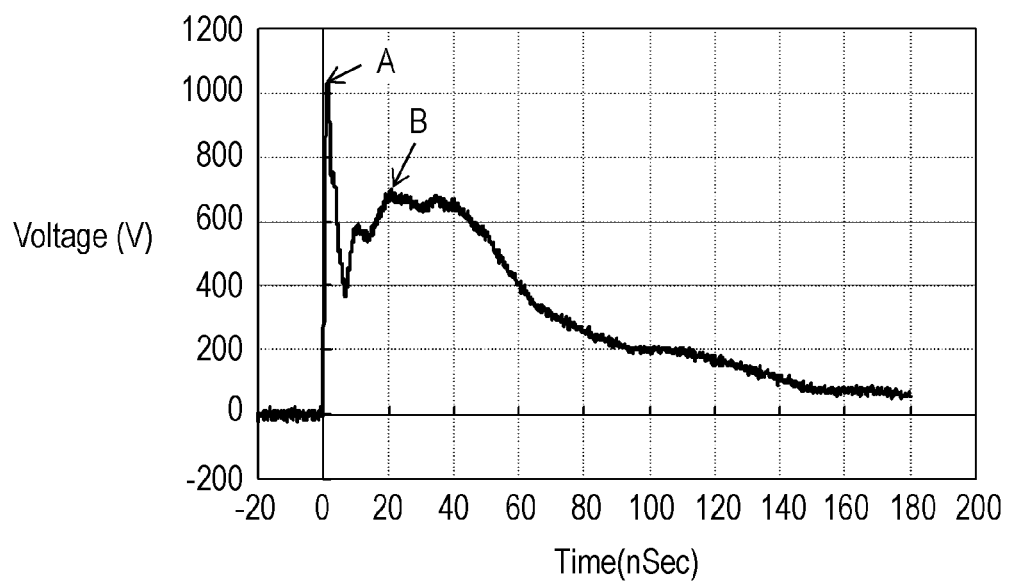
FIG. 7A is a pulse waveform chart in an electrostatic discharge immunity test in which no surge absorbing element is set up.
Figure 7B:
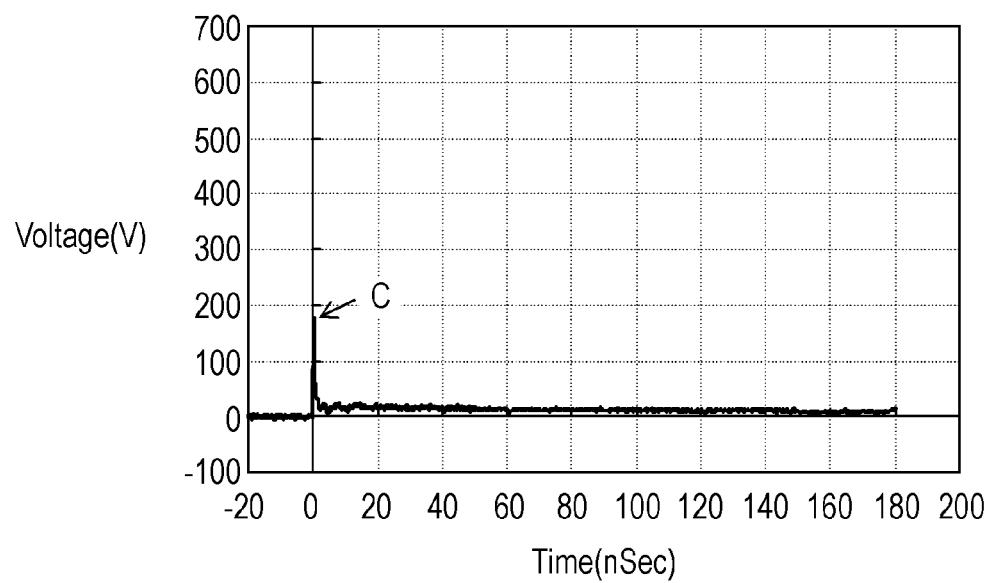
FIG. 7B is a pulse waveform chart in an electrostatic discharge immunity test in which the surge absorbing element according to the embodiment of the present invention is used.
Figure 8:
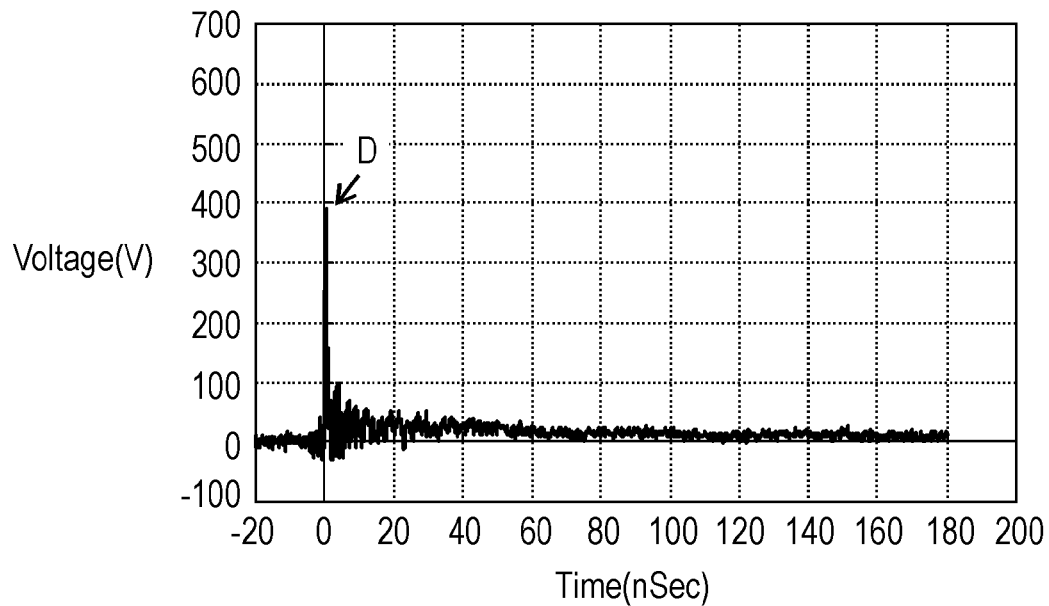
FIG. 8 is a pulse waveform chart in the electrostatic discharge immunity test in which another surge absorbing element according to the embodiment of the present invention is used.
Figure 9:
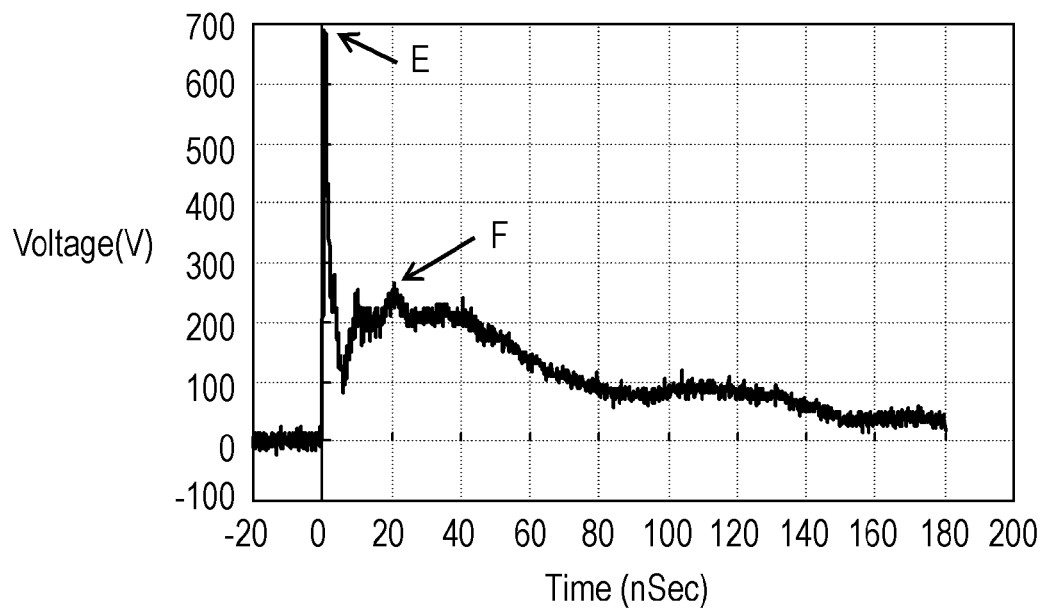
FIG. 9 is a pulse waveform view in the electrostatic discharge immunity test in which a different surge absorbing element is used for comparison with the surge absorbing elements according to the embodiment of the present invention.

FIG. 7A to FIG. 9 are pulse waveform charts obtained by making the observation through oscilloscope 85 in the electrostatic discharge immunity tests in which the ESD voltage is 8 kV. The transverse axis represents the time (nsec), and the vertical axis represents the voltage (V). FIG. 7A is a pulse waveform chart obtained when surge absorbing element 10 is not attached. FIGS. 7B, 8 and 9 show pulse waveform charts of Example 1, Example 8 and Comparative Example 1, respectively.

The resistance against static electricity is evaluated by making an ESD repeating test about ten of the samples. In the ESD repeating test, the application of an ESD voltage according to the electrostatic discharge immunity test is repeatedly performed. Specifically, the electrostatic simulator for evaluating the suppression voltage is used for applying an electrostatic pulse having an ESD voltage of 12 kV repeatedly from discharge gun 84 to surge absorbing element 10. When the insulation resistance value of surge absorbing element 10 has turned to 100 kΩ or less, the number of times of the repetitive application of the ESD voltage is obtained. The average of the repetitive numbers is then calculated. The results are shown in Table 1.

from 0% by volume to 5% by volume as in Examples 7 to 10, the void ratio of ceramic layer 11 ranges from 25% by volume to 55% by volume. However, through-voids through which electrode 12 communicates with electrode 13 are not present, either, inside ceramic layer 11 of each of these samples.

In Examples 1 to 9, the void ratio of the ceramic layer ranges from 51% by volume to 92% by volume, and the suppression voltage when the ESD voltage is 8 kV is remarkably lower than in Comparative Example 1 of which the void ratio is 5% by volume, and Comparative Example 2 of which the void ratio is 10% by volume. Furthermore, even when the ESD voltage is raised up to 12 kV, an increase in the suppression voltage is small. In this manner, Examples 1 to 9 show excellent ESD absorbency.

Also in Example 10, of which the void ratio is 25% by volume, the suppression voltage is low when the ESD voltage is 2 kV.

Particularly in Examples 1 to 6, the through-voids are made, and the ratio of the suppression voltage when the ESD voltage is 12 kV with respect to that when the ESD voltage is 2 kV is 1.10 or less. As is apparently, an increase in the suppression voltage when the ESD voltage is 12 kV is far smaller than the other samples. Also in the ESD repeating test, it is understood that the resistance against static electricity is excellent. The resistance against static electricity is remarkably improved in particular when the void ratio ranges from 64% by volume to 87% by volume (Examples 1, 3 and 5).

When Example 7 in which no through-voids are present, is compared with Example 2 in which the through-voids are present and the void ratio is equal to that of Example 7, the suppression voltage when the ESD voltage is 2 kV is 216 V in Example 7 while the voltage is 168 V in Example 2. As is apparently, the suppression voltage of Example 2 in which the

TABLE 1

| | | | | | Suppression voltage (V) | | | Static |
| Sample | Proportion (% by volume) of resin particles | Porosity (% by volume) of ceramic layer | Through-voids | Capacitance (pF) | ESD voltage of 2 kV | ESD voltage of 8 kV | ESD voltage of 12 kV | electricity resistance (repetitive times) |
|---|---|---|---|---|---|---|---|---|
| Example 1 | 50 | 78 | Present | 0.06 | 172 | 186 | 186 | 860 |
| Example 2 | 10 | 55 | Present | 0.12 | 168 | 178 | 179 | 716 |
| Example 3 | 20 | 64 | Present | 0.07 | 165 | 174 | 174 | 1060 |
| Example 4 | 40 | 74 | Present | 0.06 | 167 | 177 | 180 | 1022 |
| Example 5 | 70 | 87 | Present | 0.05 | 184 | 189 | 190 | 857 |
| Example 6 | 80 | 92 | Present | 0.04 | 190 | 195 | 198 | 720 |
| Example 7 | 5 | 55 | Absent | 0.15 | 216 | 372 | 372 | 350 |
| Example 8 | 0 | 55 | Absent | 0.15 | 222 | 388 | 524 | 396 |
| Example 9 | 0 | 51 | Absent | 0.18 | 235 | 392 | 548 | 304 |
| Example 10 | 0 | 25 | Absent | 0.43 | 262 | 682 | 993 | 120 |
| Comparative Example 1 | 0 | 5 | Absent | 0.60 | 294 | 684 | 1026 | 10 |
| Comparative Example 2 | 100 | 100 | — | 0.03 | 312 | 1046 | 1320 | 1120 |

As shown in Table 1, in the case of using a ceramic paste in which the proportion by volume of resin particles 30 ranges from 10% by volume to 80% by volume as in Examples 1 to 6, the void ratio of ceramic layer 11 ranges from 55% by volume to 92% by volume. In this case, through-voids through which electrode 12 communicates with electrode 13 are present inside ceramic layer 11.

On the other hand, in Comparative Example 1, the void ratio is 5% by volume and through-voids through which electrode 12 communicates with electrode 13 are not present inside ceramic layer 11. In the case of using a ceramic paste in which the proportion by volume of resin particles 30 ranges through-voids are present, is lower. Furthermore, the suppression voltage when the ESD voltage is 8 kV is largely raised to 372 V in Example 7 while the voltage is 178 V in Example 2. As is apparently, an increase in the ESD voltage in Example 2 in which the through-voids are present, is very small. In Example 2, the suppression voltage when the ESD voltage is 12 kV is 179 V, and the ratio of the suppression voltage when the ESD voltage is 12 kV with respect to that when the ESD voltage is 2 kV is 1.07. In other words, even when the ESD voltage is 12 kV, substantially the same suppression voltage as when the ESD voltage is 2 kV is obtained. About the resistance against static electricity, the repetitive number is 350 in Example 7 while the number is 716 in Example 2. The resistance against static electricity is remarkably improved in Example 2.

In Comparative Example 1, ESD absorption is generated by the voltage nonlinearity of the varistor material thereof when an ESD voltage is applied thereto. For this reason, when the ESD voltage is, for example, 8 kV, the suppression voltage is 684 V. Namely, the suppression voltage thereof is higher than the surface-discharge-based ESD absorption in the examples according to the present embodiment. Moreover, when the ESD voltage is high, the structure of the varistor material is easily damaged. Thus, the resistance against static electricity is very small.

In Comparative Example 2, ESD absorption is generated by gas discharge in the discharge gap. Thus, the suppression voltage is 1046 V and 1320 V when the ESD voltage is 8 kV and 12 kV, respectively. These values are remarkably higher than in the examples according to the present embodiment.

This difference appears to be based on whether or not surface discharge is generated on the exposed-surfaces, exposed to the voids, of the crystal grains within the ceramic layer. In other words, in each of Examples 1 to 10, it appears that surface discharge is generated on the exposed-surfaces, exposed to the voids, of the crystal grains within ceramic layer 11.

Comparative Example 1 has a capacitance of 0.60 pF. On the other hand, Examples 1 to 10 have small electrostatic capacities ranging from 0.04 pF to 0.43 pF; thus, the surge absorbing elements of Examples 1 to 10 make effects thereof on transmission properties of high-frequency signals smaller. As described herein, in Examples 1 to 10, the electrostatic capacities can be small while the suppression voltages can be remarkably low. Furthermore, the resistance against static electricity can be improved. When the void ratio is made as high as a value from 64% by volume to 92% by volume, the capacitance can be smaller.

Additionally, according to the waveforms in the electrostatic discharge immunity tests, the waveform shown in FIG. 7A, in which no surge absorbing element is set up, has peak A having a maximum value as a first peak, and subsequent peak B having a high value.

On the other hand, in FIG. 7B of Example 1, and FIG. 8 of Example 8, maximum peak C and maximum peak D are generated at a timing corresponding to peak A. However, no waveform similar to peak B in FIG. 7A is observed. In other words, at the time corresponding to peak B, no highest peak next to peak C or peak D is observed. The reason why such a waveform is generated would be that surface discharge is generated in voids 14 inside ceramic layer 11.

In contrast, FIG. 9 of Comparative Example 1 is comparatively high in similarity to FIG. 7A. Peak E is generated initially at a timing corresponding to peak A; and peak F having the highest value next to peak E is observed at a time corresponding to peak B.

Examples 11 and 12

In each of Examples 11 and 12, a surge absorbing element is produced in the same way as in Example 1 except for using resin particles 30 that are made of acrylic resin and are different in average particle diameter from Example 1. Resin particles 30 of Examples 11 and 12 have average particle diameters of 4.0 µm and 6.0 µm, respectively. In other words, the ratios of the average particle diameter of resin particles 30 with respect to that of the ceramic powder are 5.71 and 8.57, respectively. The ratio by volume of resin particles 30 to the total sum of the ceramic powder and resin particles 30 is set to 50% by volume in each example. Thereafter, the surge absorbing elements are evaluated in the same way as in Examples 1 to 10. The results are shown together with the results of Example 1 in Table 2.

TABLE 2

| Sample | Particle diameter (µm) of resin particles | Porosity (% by volume) of ceramic layer | Through-voids | Capacitance (pF) | Suppression voltage (V) ESD voltage of 2 kV | ESD voltage of 8 kV | ESD voltage of 12 kV | Static electricity resistance (repetitive times) |
|---|---|---|---|---|---|---|---|---|
| Example 1 | 2 | 78 | Present | 0.06 | 172 | 186 | 186 | 860 |
| Example 11 | 4 | 78 | Present | 0.06 | 175 | 183 | 187 | 855 |
| Example 12 | 6 | 78 | Present | 0.05 | 173 | 188 | 191 | 857 |

As is evident from Table 2, even when the average particle diameter of resin particles 30 is 4.0 µm or 6.0 µm, through-voids are made and properties equivalent to those when the average particle diameter is 2.0 µm are exhibited about the capacitance, the suppression voltage and the resistance against static electricity. As described herein, when the ratio of the average particle diameter of resin particles 30 with respect to that (0.7 µm) of the ceramic powder ranges from 2.8 to 8.6, inclusive, through-voids can be made, and the surge absorbing elements can obtain substantially equivalent electric characteristics when the porosities of ceramic layers 11 are the same.

Example 13

Figure 10:
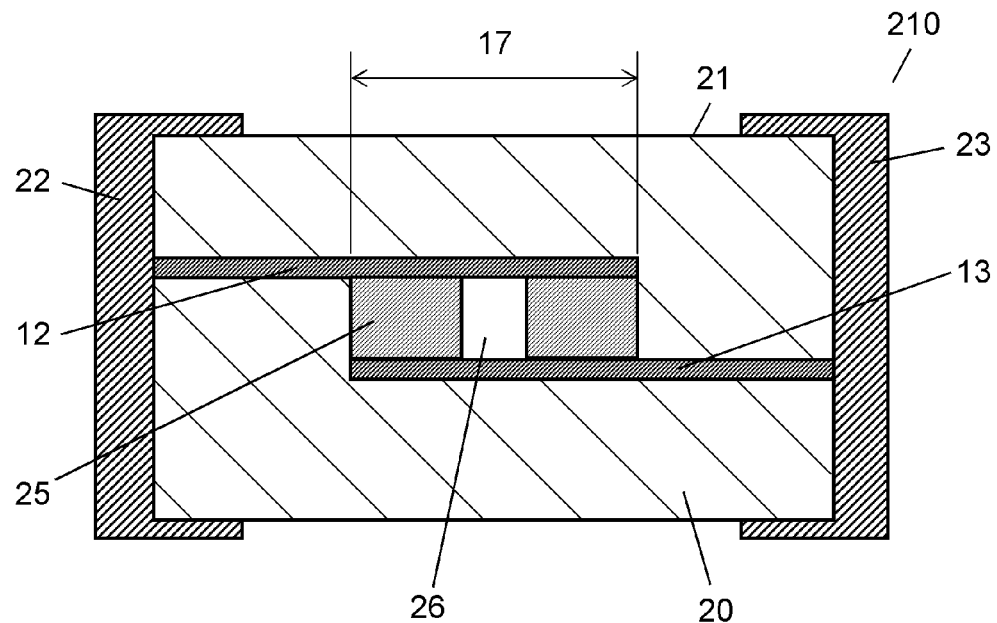
FIG. 10 is a sectional view of still another surge absorbing element according to the embodiment of the present invention.
Figure 11:
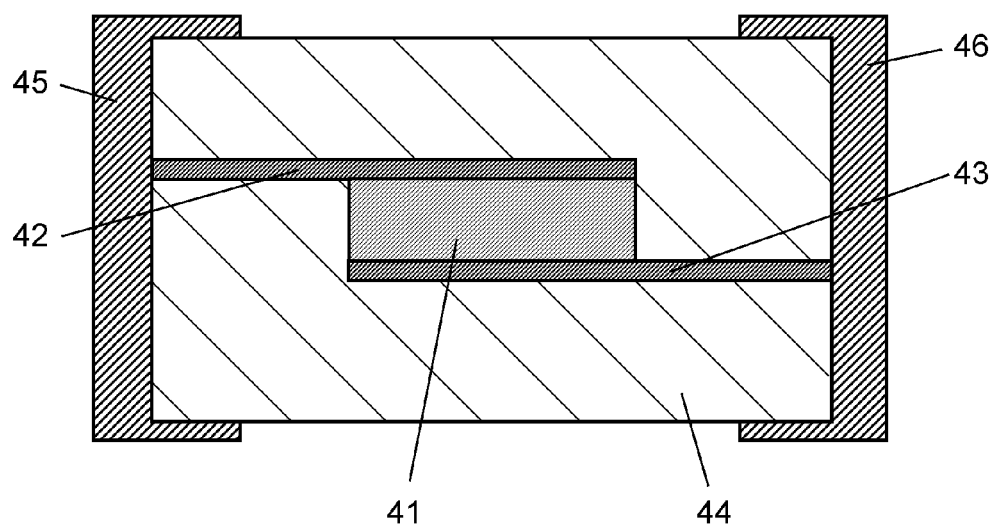
FIG. 11 is a sectional view of a conventional surge absorbing element.

As illustrated in FIG. 10, ceramic layer 25 of surge absorbing element 210 of Example 13 has single through-void 26 that has a circular cross section along the lamination surface and penetrates linearly in the layer-thickness direction, at a center of ceramic layer 25 in gap region 17. In Example 13, an acrylic resin film in a disc form is buried in a ceramic green body made of the ceramic paste in Comparative Example 1, which contains no resin particles 30, thereby forming a ceramic green body. In the same way as in Example 1 except the above, surge absorbing elements 210 are produced. When the green chip is fired, the acrylic resin film is burned out to make through-void 26.

The composition of ceramic layer 25 is $(ZnO)_{0.97}(SrCoO_3)_{0.03}$, and the void proportion by volume (or void ratio) of through-void 26 to ceramic layer 25 (100 µm in length×100 µm in width×7 µm in thickness) in gap region 17 is 15% by volume. In regions other than through-void 26 in gap region 17, ceramic layer 25 has no through-void, and the void ratio thereof is 4% by volume.

Next, electric characteristics of surge absorbing elements 210 are shown in Table 3, together with those of Comparative Example 1 described above.

TABLE 3

| Sample | Capacitance (pF) | Suppression voltage (V) | | | Static electricity resistance (repetitive times) |
| --- | --- | --- | --- | --- | --- |
| | | ESD voltage of 2 kV | ESD voltage of 8 kV | ESD voltage of 12 kV | |
| Example 13 | 0.32 | 181 | 198 | 200 | 822 |
| Comparative Example 1 | 0.60 | 294 | 684 | 1026 | 10 |

As is shown in Table 3, the suppression voltage of Example 13 is lower than that of Comparative Example 1, so that the resistance against static electricity is improved. This would be an advantageous effect based on a matter that the circumferential edge of through-void 26 where electrodes 12 and 13 contact through-void 26 functions as a discharge starting point so that surface discharge is generated in through-void 26. As described herein, when through-void 26 is made, the surge absorbing element can be made low in suppression voltage to be improved in resistance against static electricity even when the void ratio of ceramic layer 25 is less than 25% by volume.

Examples 14 to 38, and Comparative Example 3

First, a powder of ZnO as a main component, and respective oxide powders of $SrCoO_3$, $CaCoO_3$ and $BaCoO_3$ and respective oxide powders of $Co_2O_3$, $MnO_2$ and $Cr_2O_3$ as secondary components are prepared as starting materials. The starting materials are weighed to cause the secondary components contained in ceramic layer 11 to have a composition ratio shown in Table 4.

In each of Examples 14 to 20, for example, the content by percentage of $SrCoO_3$, which is one of the secondary components, is represented by x×100% by mole, the composition of ceramic layer 11 is represented by $(ZnO)_{(1-x)}(SrCoO_3)_x$.

In the grain boundary of ceramic layer 11 of each of Examples 14 to 38, a solid solution is present and the grain boundary is p-type semiconductor. This solid solution is $SrCoO_3$ in Examples 14 to 20; $CaCoO_3$ in Examples 21 to 26; and $BaCoO_3$ in Examples 27 to 32. The presences of such a solid solution can be verified through a high-resolution transmission electron microscope (HRTEM). It can also be verified through a scanning nonlinear dielectric microscope (SNDM) that grain boundary is a p-type semiconductor. About each of Examples 33 to 38 also, a solid solution having a perovskite structure and represented as one of the secondary components is present in the grain boundary of ceramic layer 11. The ceramic layer of Comparative Example 3 is made only of ZnO.

Next, about Examples 14 to 38, and Comparative Example 3, surge absorbing elements are produced in the same way as in Example 3 except that their starting materials are different. At this time, the content by percentage of resin particles 30 in the ceramic paste is set to 20% by volume, thus, the void ratio of their ceramic layer is set to 64% by volume. Inside the ceramic layer, through-voids through which electrode 12 communicates with electrode 13 are present. The results of Examples 14 to 38, and Comparative Example 3 are shown together with those of Comparative Example 1 described above in Table 4.

TABLE 4

| Sample | Secondary component | Secondary component content by percentage (% by mole) | Through-voids | Capacitance (pF) | Suppression voltage (V) | | | Static electricity resistance (repetitive times) |
| --- | --- | --- | --- | --- | --- | --- | --- | --- |
| | | | | | ESD voltage of 2 kV | ESD voltage of 8 kV | ESD voltage of 12 kV | |
| Comparative Example 3 | Not contained | 0 | Present | — | — | — | — | — |
| Example 14 | $SrCoO_3$ | 0.3 | Present | 0.06 | 182 | 193 | 194 | 975 |
| Example 15 | | 0.5 | Present | 0.08 | 175 | 182 | 181 | 1082 |
| Example 16 | | 1.0 | Present | 0.07 | 164 | 172 | 171 | 1072 |
| Example 17 | | 2.0 | Present | 0.07 | 165 | 174 | 174 | 1060 |
| Example 18 | | 5.0 | Present | 0.08 | 177 | 185 | 186 | 826 |
| Example 19 | | 10.0 | Present | 0.09 | 194 | 204 | 206 | 826 |
| Example 20 | | 15.0 | Present | 0.09 | 268 | 682 | 988 | 126 |
| Example 21 | $CaCoO_3$ | 0.3 | Present | 0.10 | 148 | 163 | 165 | 963 |
| Example 22 | | 0.5 | Present | 0.11 | 128 | 140 | 161 | 1038 |
| Example 23 | | 1.0 | Present | 0.13 | 126 | 137 | 158 | 1070 |
| Example 24 | | 5.0 | Present | 0.14 | 130 | 134 | 159 | 811 |
| Example 25 | | 10.0 | Present | 0.15 | 155 | 163 | 180 | 823 |
| Example 26 | | 15.0 | Present | 0.15 | 261 | 677 | 985 | 132 |
| Example 27 | $BaCoO_3$ | 0.3 | Present | 0.10 | 145 | 158 | 161 | 523 |
| Example 28 | | 0.5 | Present | 0.11 | 123 | 132 | 162 | 650 |
| Example 29 | | 1.0 | Present | 0.13 | 122 | 130 | 159 | 784 |
| Example 30 | | 5.0 | Present | 0.14 | 130 | 134 | 148 | 765 |
| Example 31 | | 10.0 | Present | 0.15 | 152 | 160 | 176 | 754 |
| Example 32 | | 15.0 | Present | 0.15 | 257 | 680 | 991 | 101 |
| Example 33 | $SrMnO_3$ | 1.0 | Present | 0.12 | 124 | 155 | 186 | 1095 |
| Example 34 | $CaMnO_3$ | 1.0 | Present | 0.14 | 125 | 147 | 192 | 1101 |
| Example 35 | $BaMnO_3$ | 1.0 | Present | 0.14 | 128 | 157 | 188 | 682 |
| Example 36 | $SrCrO_3$ | 1.0 | Present | 0.09 | 250 | 520 | 728 | 623 |
| Example 37 | $CaCrO_3$ | 1.0 | Present | 0.11 | 237 | 465 | 689 | 674 |
| Example 38 | $BaCrO_3$ | 1.0 | Present | 0.12 | 241 | 476 | 697 | 502 |
| Comparative Example 1 | $SrCoO_3$ | 3.0 | Absent | 0.60 | 294 | 684 | 1026 | 10 |

As shown in Table 4, in Examples 14 to 19, and Examples 21 to 25, and Examples 27 to 31, the content by percentage of $SrCoO_3$, $CaCoO_3$, or $BaCoO_3$ as one of the secondary components ranges from 0.3% by mole to 10% by mole. In each of these examples, the suppression voltage is remarkably lower and resistance against static electricity is remarkably better than in Comparative Example 1 when the ESD voltage is 2 kV to 12 kV.

In Examples 20, 26 and 32, the content by percentage of $SrCoO_3$, $CaCoO_3$, or $BaCoO_3$ as one of the secondary components is 15% by mole. Even in each of these examples, the suppression voltage is smaller and resistance against static electricity is better than in Comparative Example 1 when the ESD voltage is 2 kV.

When the content by percentage of $SrCoO_3$, $CaCoO_3$, or $BaCoO_3$ as one of the secondary components ranges from 0.3% by mole to 15% by mole, surface discharge is generated on the exposed-surfaces of the crystal grains in voids 14 inside the ceramic layer.

In addition, the capacitance of each of Examples 14 to 32 is smaller than that of Comparative Example 1.

As described above, when the content by percentage of $SrCoO_3$, $CaCoO_3$, or $BaCoO_3$ as one of the secondary components ranges from 0.3% by mole to 15% by mole, surface discharge is generated in voids penetrating through the ceramic layer so that the surge absorbing element can be made low in suppression voltage and can be improved in resistance against static electricity.

The secondary component in each of Examples 33 to 38 corresponds to a material in which Co at the site B in $SrCoO_3$, $CaCoO_3$ or $BaCoO_3$ is substituted with Mn or Cr when the content by percentage of the secondary component is 1% by mole. In the same manner as when the site B is Co, the suppression voltage is lowered and the resistance against static electricity is improved also when the site B is Mn or Cr.

In examples described above, each of the site A and the site B is a single element. However, the site A may be at least one of Sr, Ca and Ba, and the site B may be at least one of Co, Mn and Cr. In each of the group of Sr, Ca and Ba of the site A, and the group of Co, Mn and Cr of the site B, the three elements can have the same ionic valence, and the ion diameters thereof are close to each other. This matter makes it possible to produce compounds having a perovskite structure in which these elements may be substituted with each other in a solid solution state. Accordingly, electric characteristics corresponding to the blend ratio between these elements are obtained.

INDUSTRIAL APPLICABILITY

The surge absorbing element of the present invention has an advantageous effect of making the suppression voltage thereof low, so as to be useful for measures against static electricity in various electronic instruments.

The invention claimed is:

1. A surge absorbing element, comprising:
a first electrode,
a second electrode arranged to be opposed to the first electrode, and
a ceramic layer, the ceramic layer being at least partially brought into contact with the first electrode and the second electrode,
wherein the ceramic layer has a polycrystal structure comprising a plurality of crystal grains, and
wherein the ceramic layer has voids therein, a void ratio falls within a range from 25% by volume to 92% by volume, inclusive, with respect to the volume of the ceramic layer.

2. The surge absorbing element according to claim 1,
wherein the crystal grains comprise ZnO as a main component, and a solid solution that is a p-type semiconductor and has a perovskite structure present within grain boundaries of the crystal grains.

3. The surge absorbing element according to claim 1,
wherein the crystal grains comprise ZnO as a main component, and a solid solution that has a perovskite structure expressed by a composition formula of $ABO_3$ present in grain boundaries of the crystal grains,
where A is at least one of Sr, Ca and Ba, and B is at least one of Co, Mn and Cr.

4. The surge absorbing element according to claim 3,
wherein the content by percentage of the solid solution having the perovskite structure ranges from 0.3% by mole or more to 15% by mole or less of a total amount of the ZnO and the solid solution having the perovskite structure.

5. The surge absorbing element according to claim 1,
wherein each of the first and second electrodes is shaped as a sheet having a principal surface, at least one portion of the principal surface of the first electrode overlaps at least one portion of that of the second electrode with a space therebetween, so that a gap region is formed, and the ceramic layer is at least partially sandwiched between the first and second electrodes in the gap region.

6. A surge absorbing element, comprising:
a first electrode,
a second electrode arranged to be opposed to the first electrode, and
a ceramic layer, the layer being at least partially brought into contact with the first electrode and the second electrode, and the layer having a polycrystal structure comprising a plurality of crystal grains showing voltage nonlinearity,
wherein the ceramic layer satisfies at least one of the following two conditions:
a void ratio falls within a range from 25% by volume to 92% by volume, inclusive, and
a through-void, through which the first electrode communicates with the second electrode, is available;
wherein the crystal grains comprise ZnO as a main component, and a solid solution that has a perovskite structure expressed by a composition formula of $ABO_3$ present in grain boundaries of the crystal grains,
where A is at least one of Sr, Ca and Ba, and B is at least one of Co, Mn and Cr.

7. The surge absorbing element according to claim 6, wherein the content by percentage of the solid solution having the perovskite structure ranges from 0.3% by mole to 15% by mole, inclusive, of the total amount of the ZnO and the solid solution having the perovskite structure.

8. The surge absorbing element according to claim 1, wherein the crystal grains show voltage nonlinearity.

9. The surge absorbing element according to claim 1, wherein the crystal grains comprise ZnO as a main component.

10. The surge absorbing element according to claim 1, wherein the crystal grains comprise a solid solution that is a p-type semiconductor and has a perovskite structure present within grain boundaries of the crystal grains.

11. A surge absorbing element, comprising:
a first electrode,
a second electrode arranged to be opposed to the first electrode, and
a ceramic layer, the ceramic layer being at least partially brought into contact with the first electrode and the second electrode,
wherein the ceramic layer has a polycrystal structure comprising a plurality of crystal grains,
the ceramic layer includes at least one through-void, through which the first electrode communicates with the second electrode, and
the crystal grains comprise ZnO as a main component, and a solid solution that has a perovskite structure expressed by a composition formula of $ABO_3$ present in grain boundaries of the crystal grains,
where A is at least one of Sr, Ca and Ba, and B is at least one of Co, Mn and Cr.

12. The surge absorbing element according to claim 11,
wherein the content by percentage of the solid solution having the perovskite structure ranges from 0.3% by mole or more to 15% by mole or less of a total amount of the ZnO and the solid solution having the perovskite structure.

13. The surge absorbing element according to claim 11,
wherein each of the first and second electrodes is shaped as a sheet having a principal surface, at least one portion of the principal surface of the first electrode overlaps at least one portion of that of the second electrode with a space therebetween, so that a gap region is formed, and the ceramic layer is at least partially sandwiched between the first and second electrodes in the gap region.

14. The surge absorbing element according to claim 11,
wherein the crystal grains show voltage nonlinearity.

\* \* \* \* \*